United States Patent  
Shih (10) Patent No.: US 10,529,570 B1  
(45) Date of Patent: Jan. 7, 2020

(54) METHOD FOR PREPARING A SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/210,842

(22) Filed: Dec. 5, 2018

Related U.S. Application Data

(60) Provisional application No. 62/769,814, filed on Nov. 20, 2018.

(51) Int. Cl.
*H01L 21/033* (2006.01)
*H01L 21/768* (2006.01)
*H01L 23/52* (2006.01)

(52) U.S. Cl.
CPC .... *H01L 21/0337* (2013.01); *H01L 21/76802* (2013.01); *H01L 21/76831* (2013.01); *H01L 21/76843* (2013.01); *H01L 21/76877* (2013.01); *H01L 23/52* (2013.01)

(58) Field of Classification Search
CPC ........... H01L 21/0337; H01L 21/76831; H01L 23/52; H01L 21/76843; H01L 21/76802; H01L 21/76877
See application file for complete search history.

(56) References Cited

U.S. PATENT DOCUMENTS

2015/0311113 A1\* 10/2015 Zhang ................ H01L 23/5283  
257/773  
2016/0293419 A1\* 10/2016 Nam ..................... H01L 23/528  
2017/0338116 A1\* 11/2017 deVilliers ........... H01L 21/0332

\* cited by examiner

*Primary Examiner* — Duy Vu N Deo  
(74) *Attorney, Agent, or Firm* — Muncy, Geissler, Olds & Lowe, PC (57) ABSTRACT

A method for preparing a semiconductor structure includes the following steps. A target layer is formed over a substrate. A first patterned mask is formed over the target layer and includes plural first openings separate from each other. The first openings are filled with a first sacrificial layer. A patterned core layer is formed on the first sacrificial layer and includes plural closed patterns and plural second openings within the closed patterns of the patterned core layer. Plural spacers are formed on sidewalls of the patterned core layer. The spacers are removed to form a plurality of third openings over the substrate. The first sacrificial layer and the first patterned mask are etched through the third openings. The first sacrificial layer is removed to form a second patterned mask on the target layer. The target layer is etched through the second patterned mask to form a patterned target layer.

20 Claims, 11 Drawing Sheets

METHOD FOR PREPARING A SEMICONDUCTOR STRUCTURE

PRIORITY DATA

This patent application claims the benefit of U.S. Provisional Patent Application Ser. No. 62/769,814 filed Nov. 20, 2018, the entire disclosure of which is hereby incorporated by reference.

TECHNICAL FIELD

The present disclosure relates to a method for preparing a semiconductor structure, and more particularly, to a method for preparing a semiconductor structure having two-dimensional (2D) features.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is then transferred from the photomask(s) to a mask layer to form a mask pattern, and to a target layer from the mask pattern. However, with the advancing miniaturization and integration requirements of semiconductor devices, including memory devices such as dynamic random access memories (DRAMs), flash memories, static random access memories (SRAMs), and ferroelectric (FE) memories, the semiconductor structures or features for such devices become finer and more miniaturized as well. Accordingly, the continual reduction of semiconductor structure size and feature size places ever-greater demands on the techniques used to form the structures and features.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing a semiconductor structure. The method includes the following steps. A target layer is formed over a substrate. A first patterned mask is formed over the target layer. In some embodiments, the first patterned mask includes a plurality of first openings separate from each other. The plurality of first openings are filled with a first sacrificial layer. A patterned core layer is formed on the first sacrificial layer. In some embodiments, the patterned core layer includes a plurality of closed patterns and a plurality of second openings within the plurality of closed patterns of the patterned core layer. A plurality of spacers are formed on sidewalls of the patterned core layer. The plurality of spacers are removed to form a plurality of third openings over the substrate. The first sacrificial layer and the first patterned mask are etched through the plurality of third openings. The first sacrificial layer is removed to form a second patterned mask on the target layer. The target layer is etched through the second patterned mask to form a patterned target layer.

In some embodiments, the first patterned mask further includes a plurality of edge-cutting openings. In some embodiments, the plurality of edge-cutting openings are separate from the plurality of first openings.

In some embodiments, the plurality of edge-cutting openings include a plurality of first portions and a plurality of second portions coupled to the plurality of first portions. In some embodiments, the plurality of first portions of the plurality of edge-cutting openings and the plurality of first openings extend along a first direction. In some embodiments, the plurality of second portions of the plurality of edge-cutting openings extend along a second direction.

In some embodiments, the first direction is different from the second direction.

In some embodiments, the first sacrificial layer includes a multi-layered structure.

In some embodiments, a top surface of the first sacrificial layer is higher than a top surface of the first patterned mask.

In some embodiments, the patterned core layer further includes at least an isolated pattern disposed within one of the plurality of closed patterns. In some embodiments, the isolated pattern is separate from the one of the plurality of closed patterns by the plurality of second openings.

In some embodiments, the plurality of closed patterns include a plurality of third portions and a plurality of fourth portions extending along a first direction and a plurality of fifth portions extending along a second direction different from the first direction.

In some embodiments, the plurality of third portions and the plurality of fourth portions are alternately arranged.

In some embodiments, a width of the plurality of third portions is greater than a width of the plurality of fourth portions.

In some embodiments, the step of forming the plurality of spacers further includes the following steps. A spacer layer is disposed to cover sidewalls and bottoms of the plurality of second openings and a top surface of the patterned core layer. Portions of the spacer layer are removed from the top surface of the patterned core layer to form the plurality of spacers.

In some embodiments, a top surface of the second sacrificial layer is coplanar with top surfaces of the plurality of spacers and a top surface of the patterned core layer.

In some embodiments, the second patterned mask includes a plurality of fourth openings and a plurality of fifth openings. In some embodiments, the plurality of fourth openings and the plurality of fifth openings are coupled to each other.

In some embodiments, the plurality of fourth openings of the second patterned mask are formed corresponding to the plurality of first openings of the first patterned mask.

In some embodiments, the plurality of fifth openings of the second patterned mask are formed corresponding to the plurality of third openings.

In some embodiments, the method further includes etching the target layer through the second patterned mask to form a patterned target layer.

In some embodiments, the patterned target layer includes a plurality of first features and a plurality of second features. In some embodiments, the plurality of first features are two-dimensional (2D) features, and the plurality of second features are one-dimensional (1D) features.

In some embodiments, the plurality of first features and the plurality of second features are separate from each other.

In some embodiments, the patterned target layer further includes a pair of edge features disposed at top side and a bottom side of the semiconductor structure from a top view.

In some embodiments, the pair of edge features are separate from the plurality of first features and the plurality of second features.

In the present disclosure, the method for preparing the semiconductor structure is provided. According to the method, the first patterned mask includes portions of a to-be-formed pattern of a semiconductor structure. By etching the first patterned mask, other portions of the to-be-formed pattern are obtained and the second patterned mask including the complete to-be-formed pattern is formed. Accordingly, the second patterned mask can be used to form the patterned target layer. Significantly, by forming the to-be-formed pattern in the second patterned mask in two steps the 2D features and 1D features can be precisely and accurately formed without increasing process cost and process complexity.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 2A to 2C are schematic diagrams illustrating a fabrication stage constructed according to the method for preparing the semiconductor structure in accordance with some embodiments of the present disclosure, wherein

FIGS. 3A to 3C are schematic diagrams illustrating a fabrication stage subsequent to the fabrication stage shown in FIGS. 2A to 2C, wherein

FIGS. 4A to 4C are schematic diagrams illustrating a fabrication stage subsequent to the fabrication stage shown in FIGS. 3A to 3C, wherein

FIGS. 5A to 5C are schematic diagrams illustrating a fabrication stage subsequent to the fabrication stage shown in FIGS. 4A to 4C, wherein

FIGS. 6A to 6C are schematic diagrams illustrating a fabrication stage subsequent to the fabrication stage shown in FIGS. 5A to 5C, wherein

FIGS. 7A to 7C are schematic diagrams illustrating a fabrication stage subsequent to the fabrication stage shown in FIGS. 6A to 6C, wherein

FIGS. 8A to 8C are schematic diagrams illustrating a fabrication stage subsequent to the fabrication stage shown in FIGS. 7A to 7C, wherein

FIGS. 9A to 9C are schematic diagrams illustrating a fabrication stage subsequent to the fabrication stage shown in FIGS. 8A to 8C, wherein

FIGS. 10A to 10C are schematic diagrams illustrating a fabrication stage subsequent to the fabrication stage shown in FIGS. 9A to 9C, wherein

FIGS. 11A to 11C are schematic diagrams illustrating a fabrication stage subsequent to the fabrication stage shown in FIGS. 10A to 10C, wherein

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, via, pillars, trenches, troughs, or moats. As used herein, the term "core" refers to a mask feature formed at a vertical level. As used herein, the term "target layer" refers to a layer in which a pattern of semiconductor structures is to be formed. A target layer may be part of the substrate. A target layer may be a metal layer, a semiconductor layer, and/or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch process or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Figure 1:
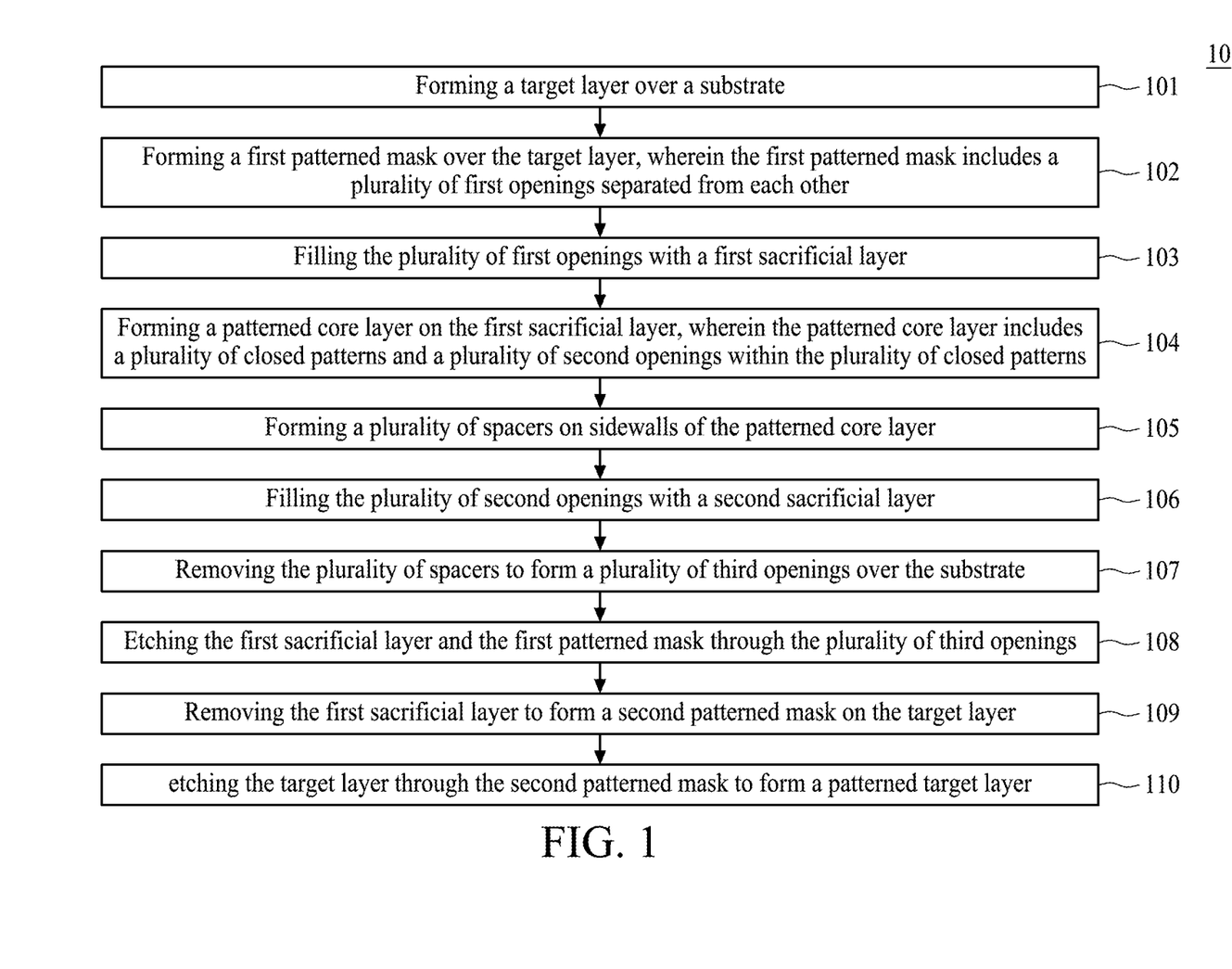
FIG. 1 is a flow diagram illustrating a method for preparing semiconductor structures, in accordance with some embodiments of the present disclosure.

FIG. 1 is a flow diagram illustrating a method for preparing a semiconductor structure, in accordance with some embodiments of the present disclosure. The method for preparing a semiconductor structure 10 includes a step 101, providing a target layer over a substrate. The method for preparing the semiconductor structure 10 further includes a step 102, forming a first patterned mask over the target layer. In some embodiments, the first patterned mask includes a plurality of first openings separate from each other. The method for preparing the semiconductor structure 10 further includes a step 103, filling the plurality of first openings with a first sacrificial layer. The method for preparing the semiconductor structure 10 further includes a step 104, forming a patterned core layer on the first sacrificial layer. In some embodiments, the patterned core layer includes a plurality of closed patterns and a plurality of second openings within the plurality of closed patterns. The method for preparing the semiconductor structure 10 further includes a step 105, forming a plurality of spacers on sidewalls of the plurality of closed patterns of the patterned core layer. The method for preparing the semiconductor structure 10 further includes a step 106, filling the plurality of second openings with a second sacrificial layer. The method for preparing the semiconductor structure 10 further includes a step 107, removing the plurality of spacers to form a plurality of third openings within the second sacrificial layer. The method for preparing the semiconductor structure 10 further includes a step 108, etching the first sacrificial layer and the first patterned mask through the plurality of third openings. The method for preparing the semiconductor structure 10 further includes a step 109, removing the first sacrificial layer to form a second patterned mask. The method for preparing the semiconductor structure 10 further includes a step 110, etching the target layer through the second patterned mask to form a patterned target layer. The method for preparing the semiconductor structure 10 will be further described according to one or more embodiments below.

Figure 2A:
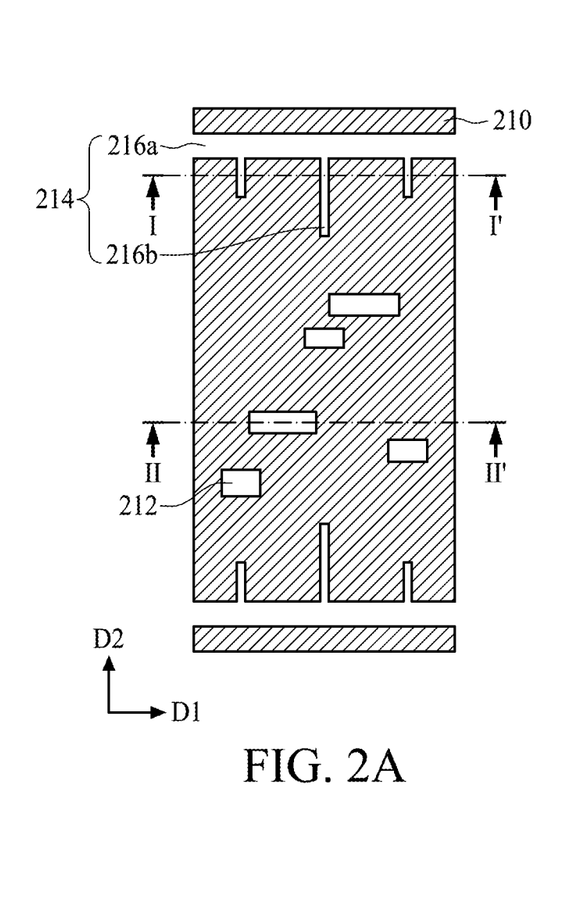
Figure 2B:
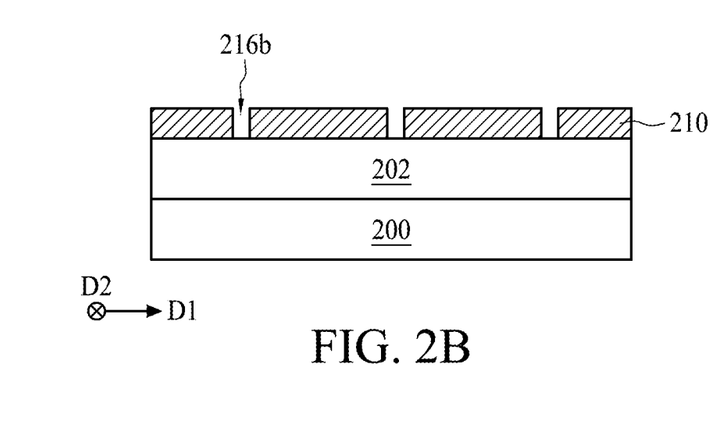
FIG. 2B is a cross-sectional view taken along line I-I' of FIG. 2A.
Figure 2C:
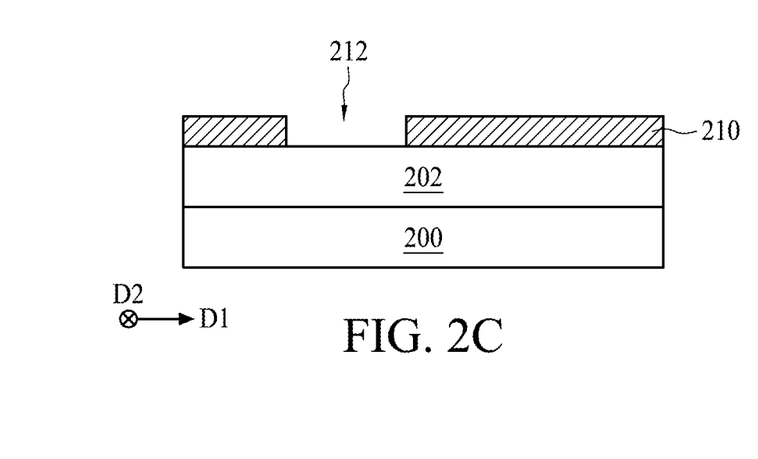
FIG. 2C is a cross-sectional view taken along line II-II' of FIG. 2A.

FIGS. 2A to 2C are schematic diagrams illustrating a fabrication stage constructed according to the method for preparing the semiconductor structure 10 in accordance with some embodiments of the present disclosure, wherein FIG. 2B is a cross-sectional view taken along line I-I' of FIG. 2A, and FIG. 2C is a cross-sectional view taken along line II-II' of FIG. 2A. Referring to FIGS. 2A to 2C, a substrate 200 is provided. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or the combination thereof. In some embodiments of the present disclosure, a target layer 202 is formed over the substrate 200 according to step 101. The target layer 202 can include multiple layers or a single layer. The target layer 202 may be a layer in which various IC components, parts, or structures are to be formed through IC fabrication processes. Examples of the components, parts, and structures include transistors, capacitors, resistors, diodes, conductive lines, electrodes and trenches. The target layer 202 can include materials that are selected based on the types of devices to be formed. In some embodiments, the material used to form the target layer 202 can include a conductive material, a semiconductive material or a dielectric material.

Still referring to FIGS. 2A to 2C, a first patterned mask 210 is formed over the target layer 202 and the substrate 200 according to step 102. In some embodiments of the present disclosure, the first patterned mask 210 includes a single-layered structure, but the disclosure is not limited thereto. In some embodiments, the first patterned mask 210 can include silicon-rich oxide (SRO), silicon oxide (SiO), silicon nitride (SiN), and silicon oxynitride (SiON), but the disclosure is not limited thereto. One of ordinary skill in the art would easily understand that the present disclosure may select a single hard mask or a bi-layered hard mask based on cost, time, performance, and processing considerations for a given application. As shown in FIGS. 2A, 2B and 2C, the first patterned mask 210 includes a plurality of first openings 212 and a plurality of edge-cutting openings 214. The plurality of first openings 212 are separate from each other and separate from the plurality of edge-cutting openings 214, as shown in FIG. 2A. In some embodiments, lengths and widths of the plurality of first openings 212 may be the same as each other. In alternative embodiments, the lengths and the widths of the plurality of first openings 212 may be different from each other, depending on the product requirement or design requirement. In some embodiments, each of the first openings 212 extends along a first direction D1, as shown in FIGS. 2A and 2C, but the disclosure is not limited thereto.

The plurality of edge-cutting openings 214 are disposed on a top side and a bottom side of the patterned mask 210 from a top view, as shown in FIG. 2A. In some embodiments, the plurality of edge-cutting openings 214 disposed on the top and bottom sides of the first pattern mask 210 are symmetrical, but the disclosure is not limited thereto. The plurality of edge-cutting openings 214 include a plurality of first portions 216a and a plurality of second portions 216b coupled to the plurality of first portions 216a. As shown in FIGS. 2A and 2B, the plurality of first portions 216a extend along the first direction D1, while the plurality of second portions 216b extend along a second direction D2, which is different from the first direction D1. In some embodiments, the first direction D1 and the second direction are perpendicular to each other, but the disclosure is not limited thereto. In some embodiments, a width of the second portions 216b of the edge-cutting openings 214 is less than a width of the first portions 216a of the edge-cutting openings 214, but the disclosure is not limited thereto. Further, a depth of the plurality of first openings 212 and a depth of the plurality of edge-cutting openings 214 are the same.

Figure 3A:
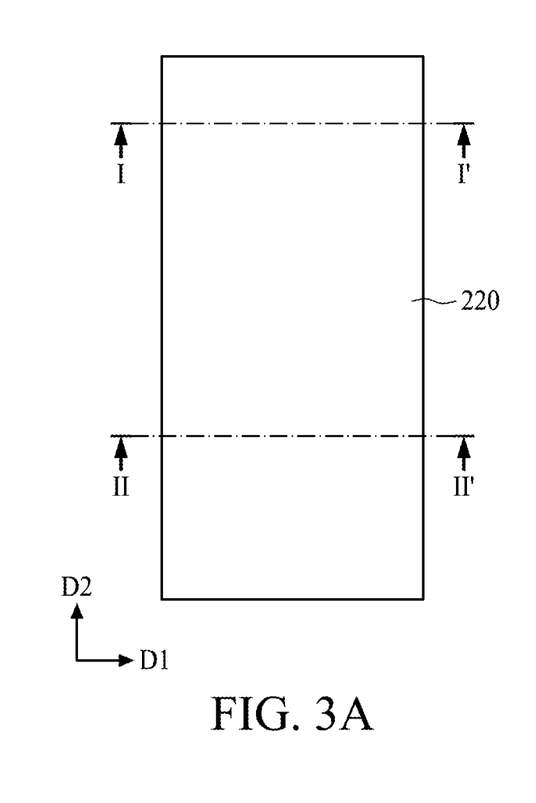
Figure 3B:
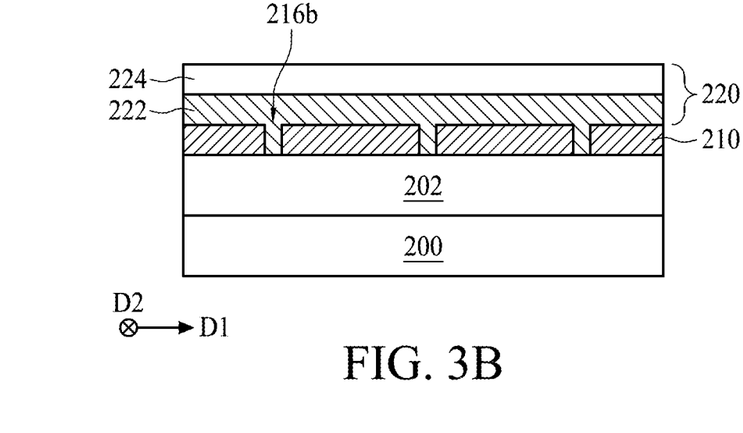
FIG. 3B is a cross-sectional view taken along line I-I' of FIG. 3A.
Figure 3C:
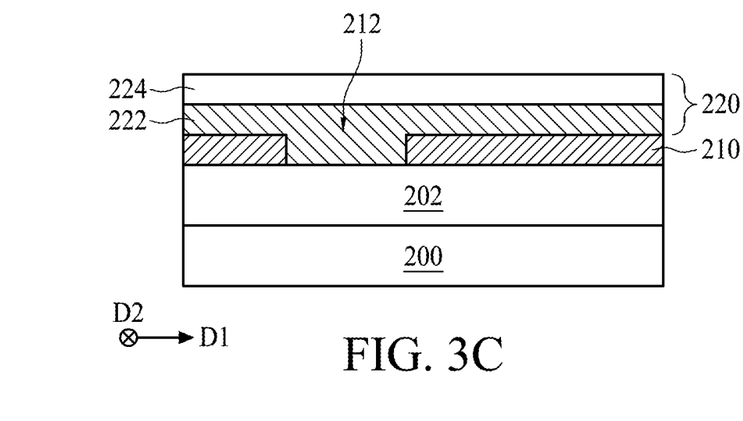
FIG. 3C is a cross-sectional view taken along line II-II' of FIG. 3A.

FIGS. 3A to 3C are schematic diagrams illustrating a fabrication stage subsequent to the fabrication stage shown in FIGS. 2A to 2C, wherein FIG. 3B is a cross-sectional view taken along line I-I' of FIG. 3A, and FIG. 3C is a cross-sectional view taken along line II-II' of FIG. 3A. In some embodiments of the present disclosure, the plurality of first openings 212 and the plurality of edge-cutting openings 214 are all filled with a first sacrificial layer 220, according to step 103. In some embodiments, the first sacrificial layer 220 can be formed by spin-on coating. In other embodiments, the first sacrificial layer 220 can be formed by other types of deposition, but the disclosure is not limited thereto. As shown in FIGS. 3A, 3B and 3C, the first sacrificial layer 220 is formed to fill the plurality of first openings 212 and the plurality of edge-cutting openings 214 in the first patterned mask 210, therefore a substantially even and flat top surface is obtained over the substrate 200. Further, the top surface of the first sacrificial layer 220 is higher than a top surface of the first patterned mask 210. In some embodiments, the first sacrificial layer 220 can be a multi-layered structure, but the disclosure is not limited thereto. The multi-layered structure can include a first layer 222 and a second layer 224. Further, the first layer 222 and the second layer 224 can include different materials or materials sufficiently different in compositions that the second layer 224 can be selectively removable using an appropriate etch chemistry relative to the first layer 222. For example but not limited thereto, the first layer 222 can include a spin-on silicon oxide layer, an optical planarization layer (OPL), or an organic material layer, while the second layer 224 can include material similar to or different from the first layer 222, but the disclosure is not limited thereto. In some embodiments, the first layer 222 fills the plurality of first openings 212 and the plurality of edge-cutting openings 214, and a thickness of the first layer 222 can be greater than a depth of the plurality of first openings 212 and the plurality of edge-cutting openings 214. The second layer 224 is formed on the first layer 222 to form the even and flat top surface.

Figure 4A:
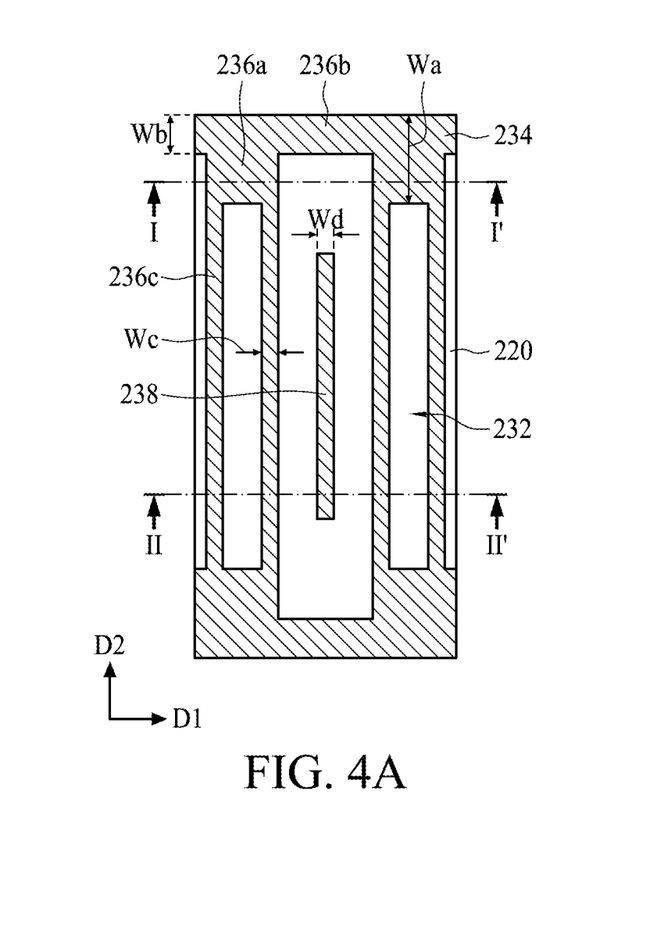
Figure 4B:
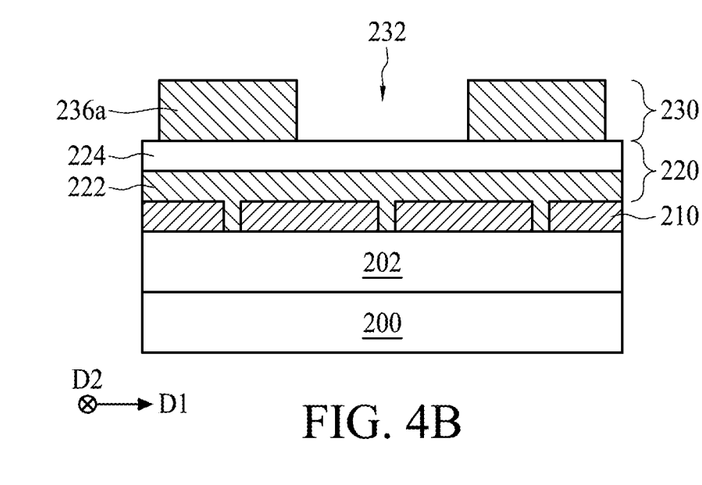
FIG. 4B is a cross-sectional view taken along line I-I' of FIG. 4A.
Figure 4C:
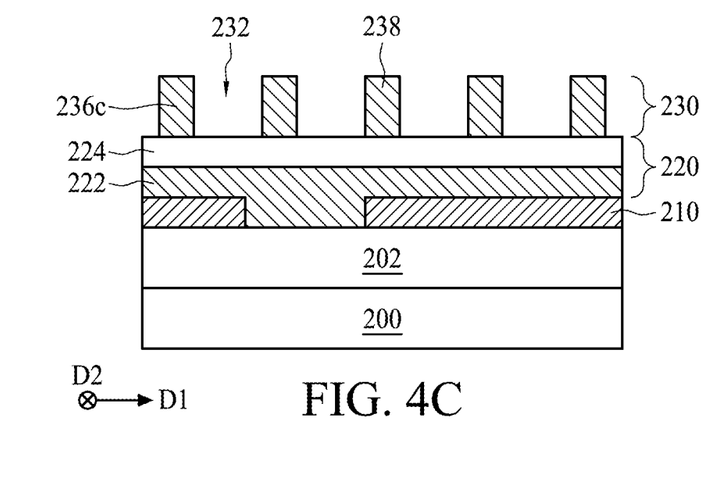
FIG. 4C is a cross-sectional view taken along line II-II' of FIG. 4A.

FIGS. 4A to 4C are schematic diagrams illustrating a fabrication stage subsequent to the fabrication stage shown in FIGS. 3A to 3C, wherein FIG. 4B is a cross-sectional view taken along line I-I' of FIG. 4A, and FIG. 4C is a cross-sectional view taken along line II-II' of FIG. 4A. A patterned core layer 230 is formed on the first sacrificial layer 220 according to step 104. The patterned core layer 230 can also be referred to as a mandrel layer, in some embodiments. The patterned core layer 230 can include material or materials sufficiently different in compositions from that of the first sacrificial layer 220. In some embodiments, the patterned core layer 230 can include material the same as the first layer 222 of the first sacrificial layer 220, but the disclosure is not limited thereto. As shown in FIGS. 4A, 4B and 4C, the patterned core layer 230 includes a plurality of second openings 232 and a plurality of closed patterns 234. Further, the plurality of second openings 232 is within the plurality of closed patterns 234 and separated from each other by the plurality of closed patterns 234 from the top view. The plurality of second openings 232 can include different widths, as shown in FIG. 4A.

In some embodiments, the plurality of closed patterns 234 are all coupled to each other, but the disclosure is not limited thereto. In some embodiments, the plurality of closed patterns 234 includes a plurality of third portions 236a and a plurality of fourth portions 236b extending along the first direction D1, and a plurality of fifth portions 236c extending along the second direction D2, as shown in FIG. 4A. In some embodiments, the plurality of third portions 236a, the plurality of fourth portions 236b and the plurality of fifth portions 236c are coupled to each other, but the disclosure is not limited thereto. In some embodiments, the plurality of third portions 236a and the plurality of fourth portions 236b are alternately arranged. In some embodiments, two ends of each of the plurality of fifth portions 236a are coupled to the plurality of third portions 236a, as shown in FIG. 4A. A width Wa of the third portions 236a is greater than a width Wb of the fourth portions 236b, but the disclosure is not limited thereto. Additionally, the width Wa of the third portions 236a and the width Wb of the fourth portions 236b are greater than a width Wc of the fifth portions 236c.

In some embodiments, the patterned core layer 230 further includes at least an isolated pattern 238 disposed within one of the plurality of closed patterns 234. Further, the isolated pattern 238 is separated from the one of the plurality of closed patterns 234 by the second opening 232, as shown in FIGS. 4A and 4C. The isolated pattern 238 extends along the second direction D2. In other words, the isolated pattern 238 is parallel to the plurality of fifth portions 236c of the closed patterns 234. Further, a width Wd of the isolated pattern 238 is substantially the same as the width Wc of the plurality of fifth portions 236c of the closed pattern 234.

Figure 5A:
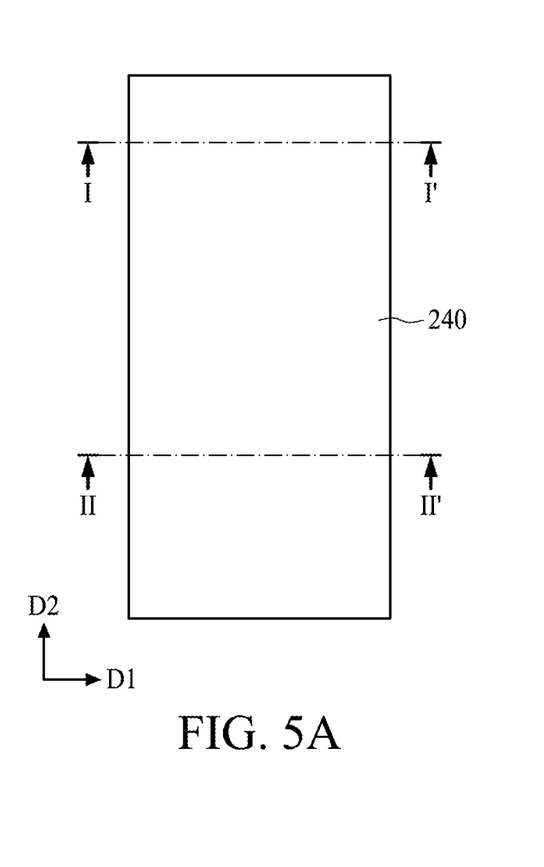
Figure 5B:
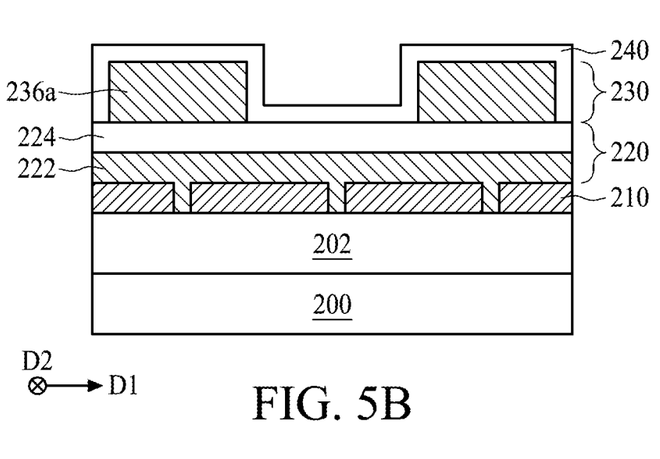
FIG. 5B is a cross-sectional view taken along line I-I' of FIG. 5A.
Figure 5C:
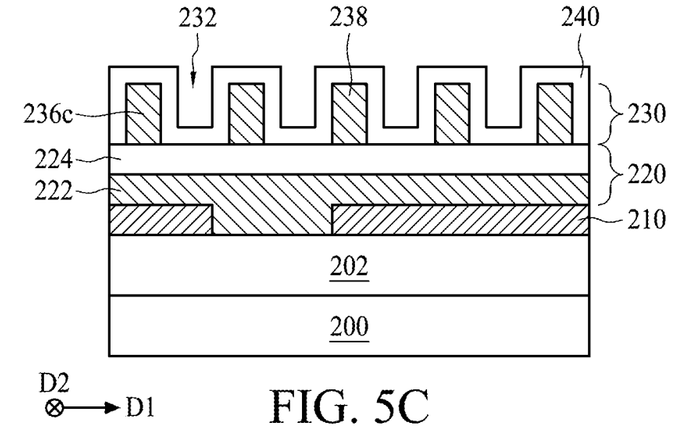
FIG. 5C is a cross-sectional view taken along line II-II' of FIG. 5A.

FIGS. 5A to 5C are schematic diagrams illustrating a fabrication stage subsequent to the fabrication stage shown in FIGS. 4A to 4C, wherein FIG. 5B is a cross-sectional view taken along line I-I' of FIG. 5A, and FIG. 5C is a cross-sectional view taken along line II-II' of FIG. 5A. A spacer layer 240 is formed over the substrate 200. The spacer layer 240 is conformally formed to cover or coat sidewalls and bottoms of each of the plurality of second openings 232. Further, the spacer layer 240 covers top surfaces of the plurality of closed patterns 234 of the patterned core layer 230, as shown in FIGS. 5A to 5C. The spacer layer 240 can include materials different from those of the patterned core layer 230, but the disclosure is not limited thereto. In some embodiments, a thickness of the spacer layer 240 is between approximately 10 nm and approximately 50 nm, but the disclosure is not limited thereto.

Figure 6A:
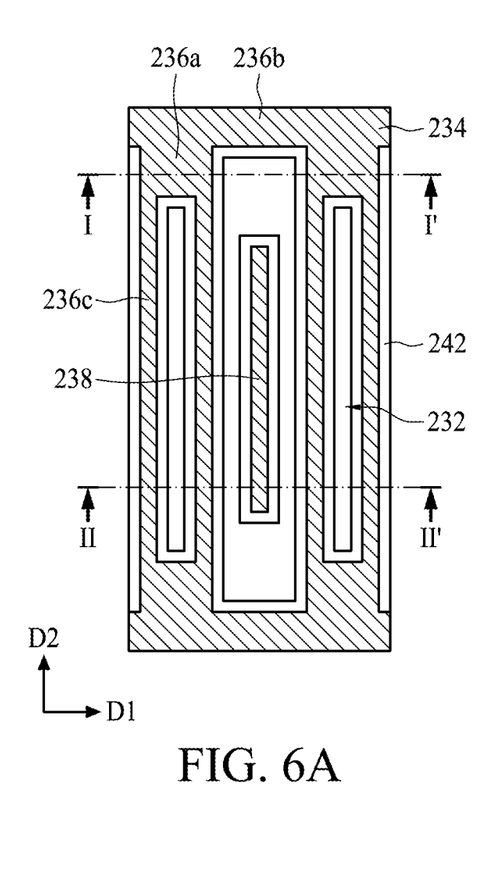
Figure 6B:
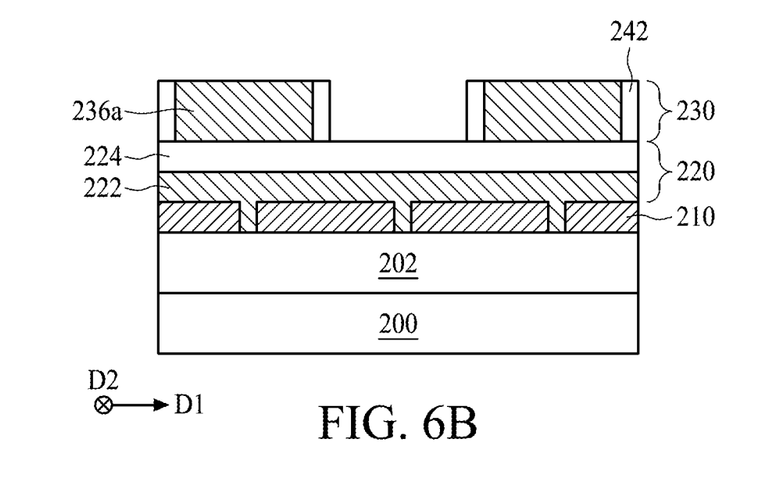
FIG. 6B is a cross-sectional view taken along line I-I' of FIG. 6A.
Figure 6C:
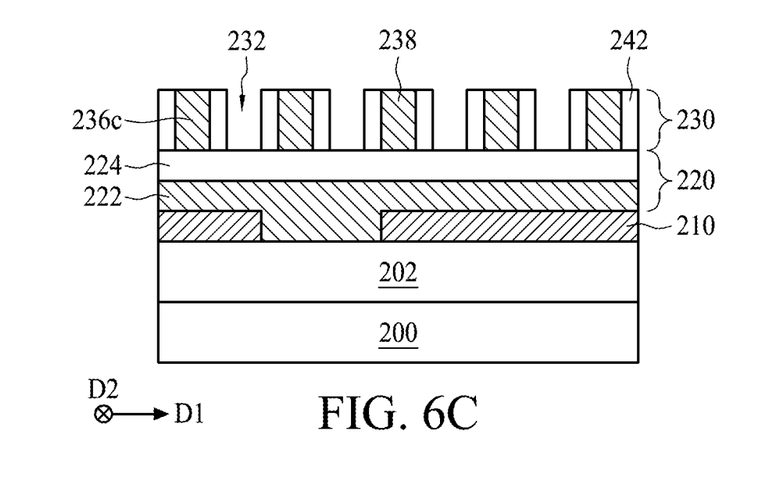
FIG. 6C is a cross-sectional view taken along line II-II' of FIG. 6A.

FIGS. 6A to 6C are schematic diagrams illustrating a fabrication stage subsequent to the fabrication stage shown in FIGS. 5A to 5C, wherein FIG. 6B is a cross-sectional view taken along line I-I' of FIG. 6A, and FIG. 6C is a cross-sectional view taken along line II-II' of FIG. 6A. Referring to FIGS. 6A to 6C, portions of the spacer layer 240 are removed from the top surfaces of the plurality of closed patterns 234 and the isolated pattern 238 of the patterned core layer 230 and the bottoms of the second openings 232. Accordingly, a plurality of spacers 242 are formed on sidewalls of the plurality of closed patterns 234 of the patterned core layer 230, according to step 105. The plurality of spacers 242 are also formed on sidewalls of the isolated pattern 238 of the patterned core layer 230. As shown in FIGS. 6A to 6C, portions of the first sacrificial layer 220 are exposed. In addition, a thickness of the plurality of spacers 242 is substantially similar to the thickness of the spacer layer 240.

Figure 7A:
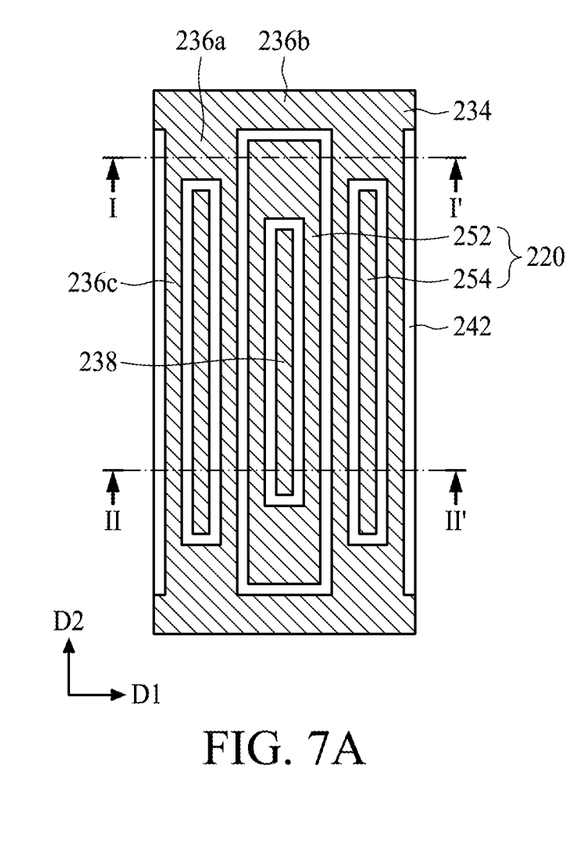
Figure 7B:
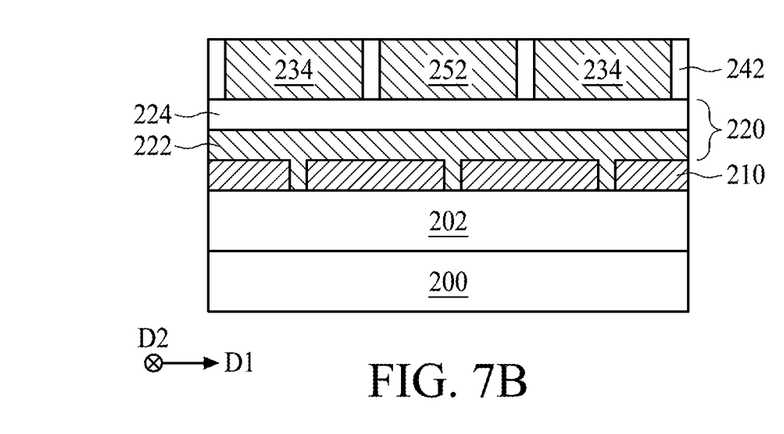
FIG. 7B is a cross-sectional view taken along line I-I' of FIG. 7A.
Figure 7C:
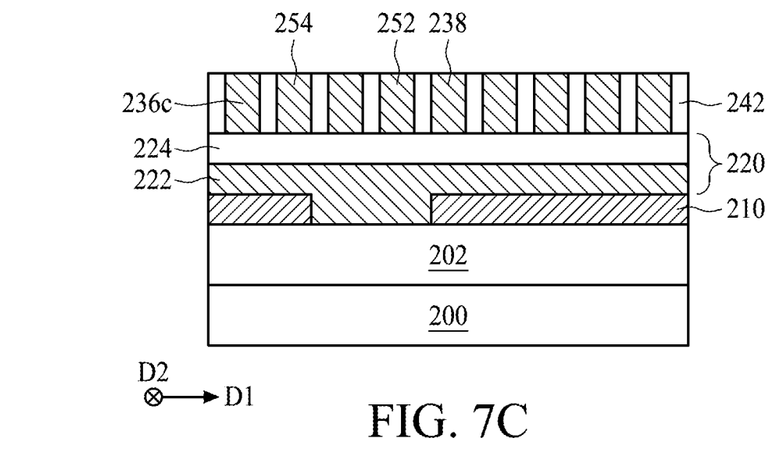
FIG. 7C is a cross-sectional view taken along line II-II' of FIG. 7A.

FIGS. 7A to 7C are schematic diagrams illustrating a fabrication stage subsequent to the fabrication stage shown in FIGS. 6A to 6C, wherein FIG. 7B is a cross-sectional view taken along line I-I' of FIG. 7A, and FIG. 7C is a cross-sectional view taken along line II-II' of FIG. 7A. In some embodiments of the present disclosure, a second sacrificial layer 250 is formed to fill the plurality of second openings 232, according to step 106. In some embodiments, the second sacrificial layer 250 is formed by spin-on coating. In other embodiments, the second sacrificial layer 250 is formed by another type of deposition. Further, excessive portions of the second sacrificial layer 250 can be removed such that a top surface of the second sacrificial layer 250 is coplanar with top surfaces of the plurality of spacers 242 and the top surface of the patterned core layer 230 (i.e., the top surfaces of the plurality of closed patterns 234 and the top surface of the isolated pattern 238). Accordingly, a substantially even and flat surface is obtained as shown in FIGS. 7A to 7C. In some embodiments, the second sacrificial layer 250 can be a single-layered structure, but the disclosure is not limited thereto. The second sacrificial layer 250 can include materials different from those of the spacers 242. In some embodiments, the second sacrificial layer 250 can include materials the same as those of the patterned core layer 230, but the disclosure is not limited thereto.

In some embodiments, the second sacrificial layer 250 also includes a plurality of closed patterns 252 and a plurality of isolated patterns 254. The plurality of closed patterns 252 and the plurality of isolated patterns 254 are separated from each other by the plurality of spacers 242, as shown in FIG. 7A. Consequently, the plurality of closed patterns 234 and the isolated pattern 238 of the patterned core layer 230, and the plurality of closed patterns 252 and the plurality of isolated patterns 254 are all observable over the substrate 200. Further, the plurality of closed patterns 234, the isolated pattern 238, the plurality of closed patterns 252 and the plurality of isolated patterns 254 are separated from each other by the plurality of spacers 242, as shown in FIGS. 7A to 7C.

Figure 8A:
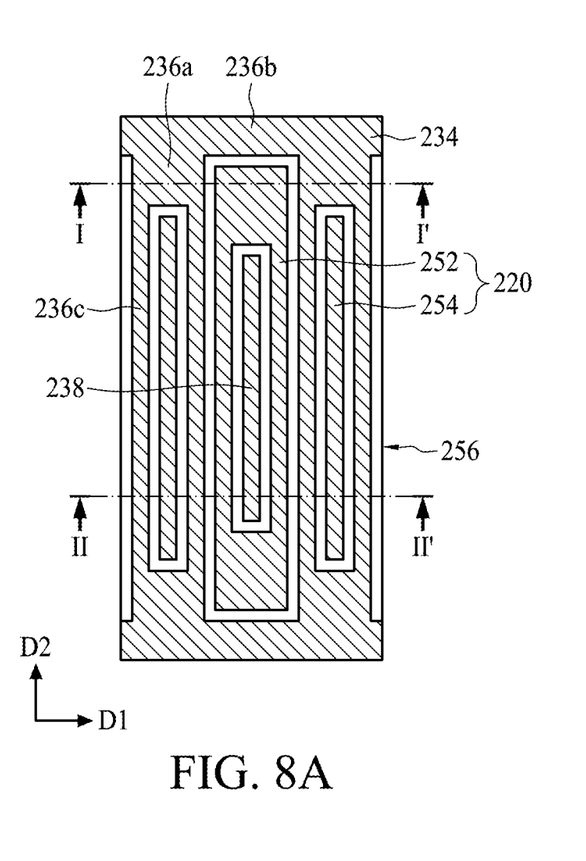
Figure 8B:
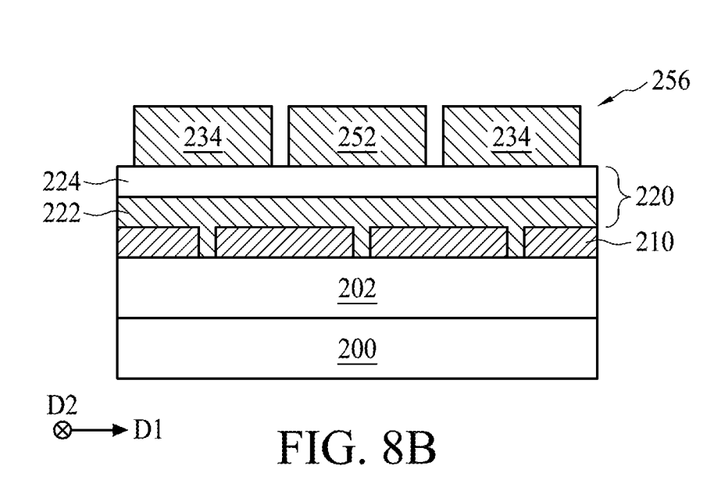
FIG. 8B is a cross-sectional view taken along line I-I' of FIG. 8A.
Figure 8C:
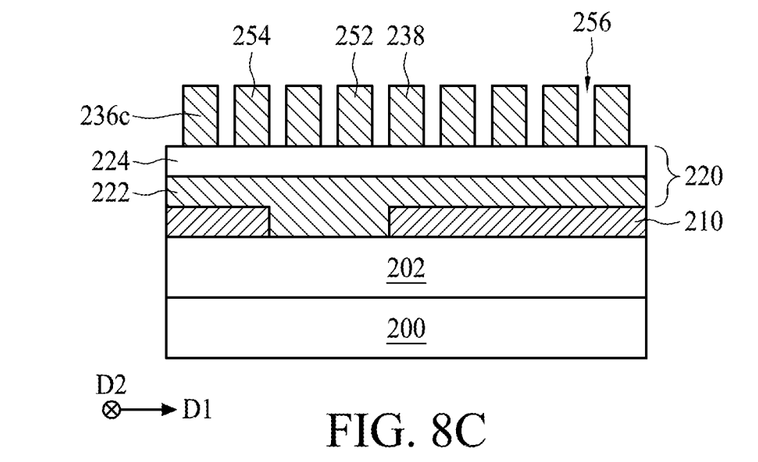
FIG. 8C is a cross-sectional view taken along line II-II' of FIG. 8A.

FIGS. 8A to 8C are schematic diagrams illustrating a fabrication stage subsequent to the fabrication stage shown in FIGS. 7A to 7C, wherein FIG. 8B is a cross-sectional view taken along line I-I' of FIG. 8A, and FIG. 8C is a cross-sectional view taken along line II-II' of FIG. 8A. The plurality of spacers 242 are removed from the substrate 200 to form a plurality of third openings 256 between the patterned core layer 230 and the second sacrificial layer 250, according to step 107. The first sacrificial layer 220 is then exposed through the plurality of third openings 256. As shown in FIGS. 8A to 8C, the patterned core layer 230 and the second sacrificial layer 250 are alternately arranged. In detail, the second sacrificial layer 250 and the third portions 236a of the closed patterns 234 of the patterned core layer 230 are alternately arranged and separated from each other by the plurality of third openings 256. Also, portions of the second sacrificial layer 250 and the fifth portions 236c of the closed patterns 234 of the patterned core layer 230 are alternately arranged and separated from each other by the plurality of third openings 256. Further, the isolation pattern 238 is also separated from the second sacrificial layer 250 by the plurality of third openings 256. Still referring to FIGS. 8A to 8C, the closed patterns 234 of the patterned core layer 230 enclose the isolated patterns 254 of the second sacrificial layer 250. The closed patterns 234 of the patterned core layer 230 also enclose the closed pattern 252 of the second sacrificial layer 250, while the closed pattern 252 of the second sacrificial layer 250 itself encloses the isolated pattern 238 of the patterned core layer 230.

In some embodiments, the isolated patterns 238 of the patterned core layer 230, the fifth portions 236c of the patterned core layer 230, the isolated patterns 254 of the second sacrificial layer 250, and portions of the closed patterns 252 of the second sacrificial layer 250 all extend along the second direction D2 and have the same widths. In some embodiments, the third openings 256 separating the patterned core layer 230 and the second sacrificial layer 250 have the same widths. The width of the plurality of third openings 256 is similar to the thickness of the plurality of spacers 242.

Figure 9A:
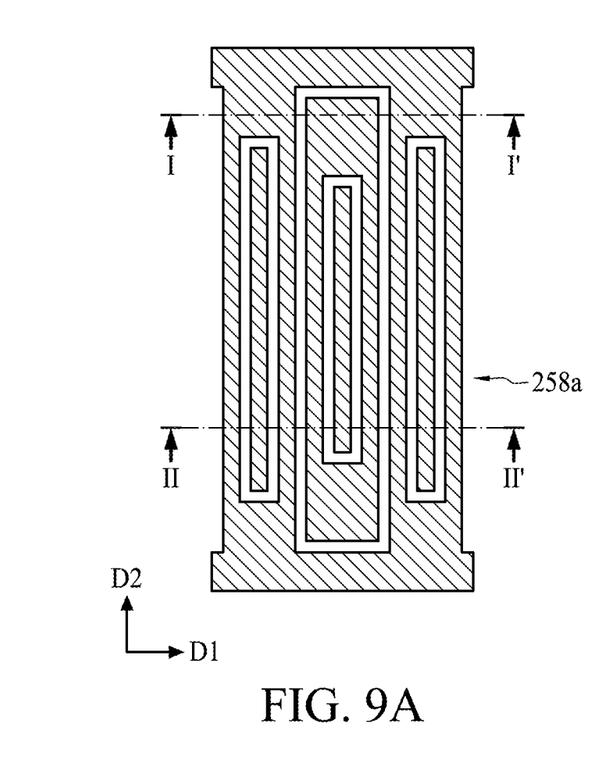
Figure 9B:
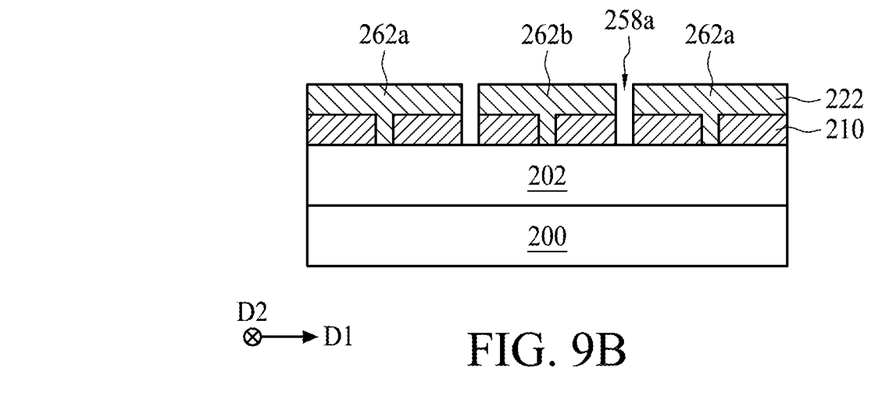
FIG. 9B is a cross-sectional view taken along line I-I' of FIG. 9A.
Figure 9C:
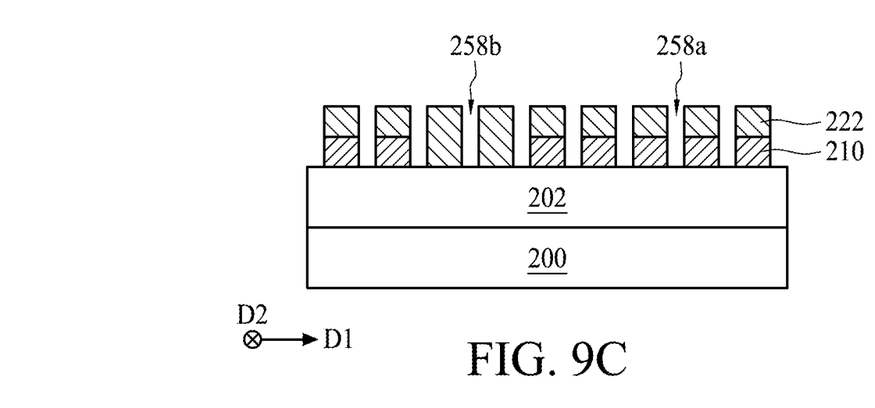
FIG. 9C is a cross-sectional view taken along line II-II' of FIG. 9A.

FIGS. 9A to 9C are schematic diagrams illustrating a fabrication stage subsequent to the fabrication stage shown in FIGS. 8A to 8C, wherein FIG. 9B is a cross-sectional view taken along line I-I' of FIG. 9A, and FIG. 9C is a cross-sectional view taken along line II-II' of FIG. 9A. The first sacrificial layer 220 and the first patterned mask 210 are etched through the plurality of third openings 256, according to step 108. Accordingly, a plurality of first recesses 258a and at least a second recess 258b are obtained over the substrate 200. In other words, the plurality of first and second recesses 258a and 258b are formed by extending the plurality of third openings 256, and thus a width of the plurality of first and second recesses 258a and 258b is similar to the width of the plurality of third openings 256, which is similar to the thickness of the plurality of spacers 242. After forming the plurality of first recesses 258a and the second recess 258b, the second sacrificial layer 250 and the patterned core layer 230 are removed. Subsequently, a portion of the first sacrificial layer 220, such as the second layer 224 of the first sacrificial layer 220, is removed. Consequently, the plurality of recesses 258a are referred to as recesses having sidewalls formed by two layers such as the first patterned mask 210 and the first sacrificial layer 220 (i.e., the first layer 222 of the first sacrificial layer 220), while the second recess 258b is referred to as a recess having sidewalls formed by one layer such as the first sacrificial layer 220 (i.e., the first layer 222 of the first sacrificial layer 220). As shown in FIGS. 9B and 9C, the target layer 202 may be exposed through the plurality of first recesses 258a and the second recess 258b.

Figure 10A:
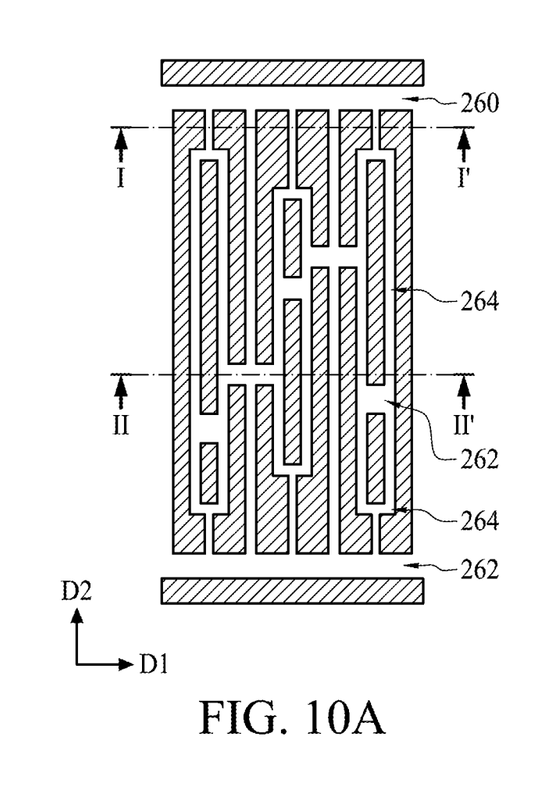
Figure 10B:
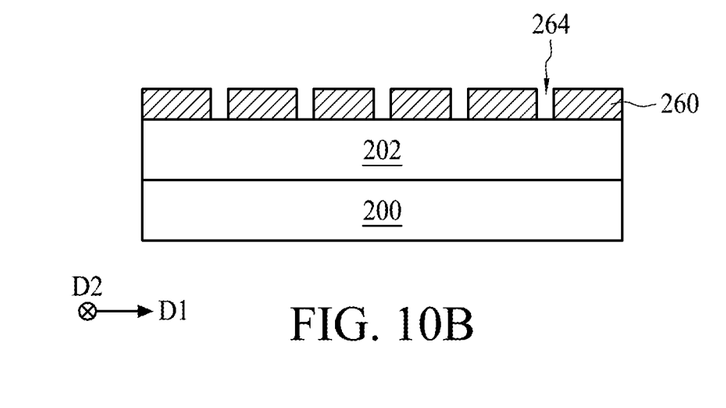
FIG. 10B is a cross-sectional view taken along line I-I' of FIG. 10A.
Figure 10C:
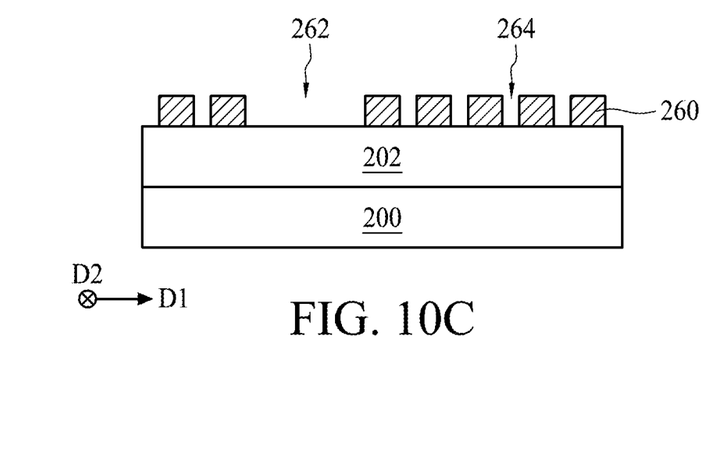
FIG. 10C is a cross-sectional view taken along line II-II' of FIG. 10A.

FIGS. 10A to 10C are schematic diagrams illustrating a fabrication stage subsequent to the fabrication stage shown in FIGS. 9A to 9C, wherein FIG. 10B is a cross-sectional view taken along line I-I' of FIG. 10A, and FIG. 10C is a cross-sectional view taken along line II-II' of FIG. 10A. The first sacrificial layer 220 (i.e., the first layer 222 of the first sacrificial layer 220) is removed, and thus a second patterned mask 260 is formed on the target layer 202, according to step 109. In some embodiments, the second patterned mask 260 can be taken as being formed by transforming the first patterned mask 210. The second sacrificial layer 250 includes a plurality of fourth openings 262 and a plurality of fifth openings 264. The plurality of fourth openings 262 and the plurality of fifth openings 264 are coupled to each other. The plurality of fourth openings 262 of the second patterned mask 260 are formed corresponding to the plurality of first openings 212 and the plurality of edge-cutting openings 214 of the first patterned mask 210. Therefore a dimension of the plurality of fourth openings 262 of the second patterned mask 260 is substantially similar to a dimension of the plurality of first openings 212 and the plurality of edge-cutting openings 214 of the first patterned mask 210. The plurality of fifth openings 264 of the second patterned mask 260 are formed corresponding to the plurality of third openings 256 of the second sacrificial layer 250. Therefore, a dimension of the plurality of fifth openings 264 is substantially similar to a dimension of the plurality of third openings 256 of the second sacrificial layer 250. Significantly, by transforming the first patterned mask 210 into the second patterned mask 260, a to-be-formed pattern is precisely formed in the second patterned mask 260.

Figure 11A:
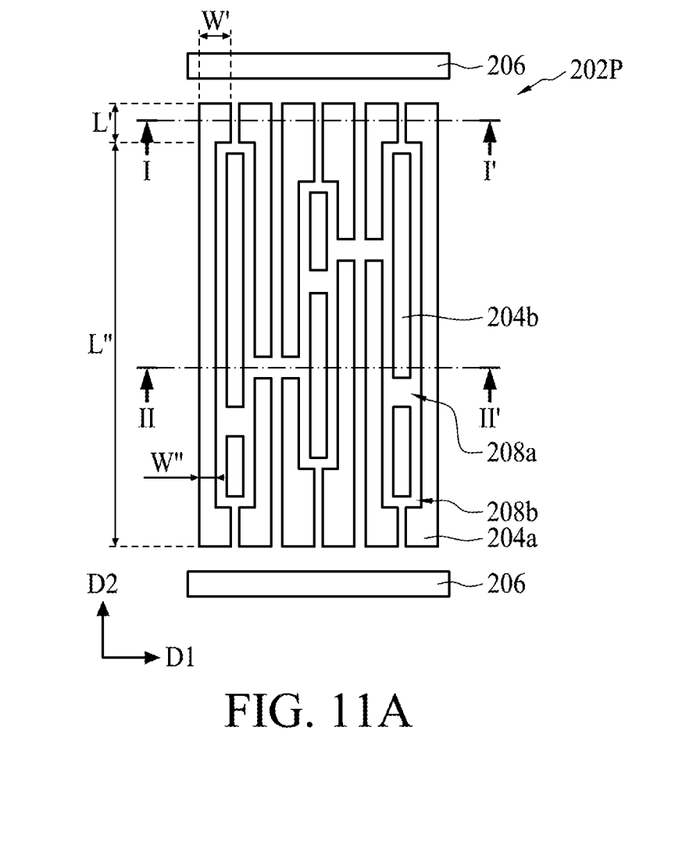
Figure 11B:
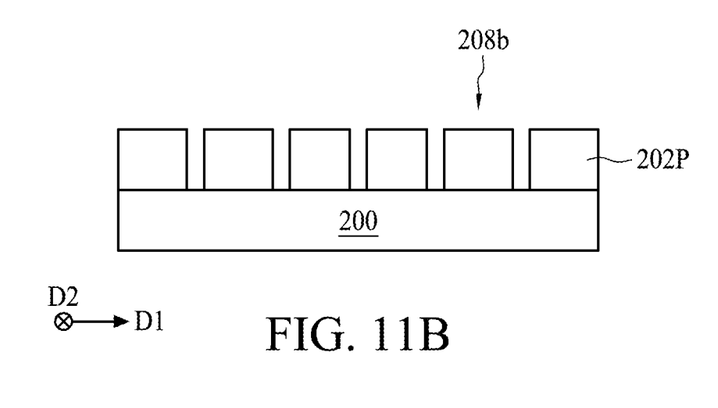
FIG. 11B is a cross-sectional view taken along line I-I' of FIG. 11A.
Figure 11C:
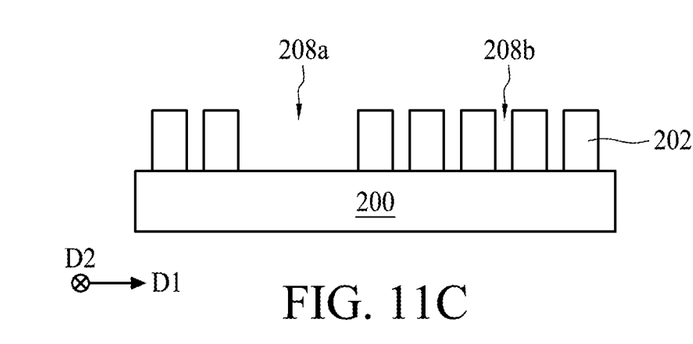
FIG. 11C is a cross-sectional view taken along line II-II' of FIG. 11A.

FIGS. 11A to 11C are schematic diagrams illustrating a fabrication stage subsequent to the fabrication stage shown in FIGS. 10A to 10C, wherein FIG. 11B is a cross-sectional view taken along line I-I' of FIG. 11A, and FIG. 11C is a cross-sectional view taken along line II-II' of FIG. 11A. The target layer 202 is etched through the second patterned mask 260 to form a patterned target layer 202P, according to step 110. The patterned target layer 202P includes a plurality of first features 204a and a plurality of second features 204b, as shown in FIG. 11A. Each of the plurality of first features 204a includes two portions respectively extending along two directions, while each of the plurality of second features 204b extends along only one direction. As shown in FIG. 11A, each of the plurality of first features 204a includes a portion extending along the first direction D1 and another portion extending along the second direction D2. Therefore each of the plurality of first features 204a is referred to as a 2D feature, while each of the plurality of second features 204b is referred to as a 1D feature. Further, in some embodiments, the patterned target layer 202P can include a pair of edge features 206 disposed at top and bottom sides of the semiconductor pattern structure from the top view. The pair of edge features 206 extend along the first direction D1, and thus the pair of edge features 206 are also referred to as a 1D feature. Additionally, the pair of 1D edge features 206 are perpendicular to the plurality of 1D second features 204b, as shown in FIG. 11A.

Still referring to FIGS. 11A to 11C, the plurality of first features 204a, the plurality of second features 204b, and the pair of edge features 206 are separated from each other by a plurality of first gaps 208a and a plurality of second gaps 208b. In some embodiments, the plurality of first gaps 208a are formed correspondingly to the plurality of fourth openings 262 of the second patterned mask 260 or the plurality of first openings 214 of the first patterned mask 210. In some embodiments, the plurality of second gaps 208b are formed corresponding to the plurality of fifth openings 264 of the second patterned mask 260 or the plurality of third openings 256 of the second sacrificial layer 250. Further, the plurality of first gaps 208a and the plurality of second gaps 208b are coupled to each other to separate and isolate the plurality of first features 204a, the plurality of second features 204b, and the pair of edge features 206 from each other.

In the present disclosure, the method for preparing the semiconductor structure 10 is provided. According to the method 10, the first patterned mask 210 includes portions of a to-be-formed pattern of a semiconductor structure. By etching the first patterned mask 210, other portions of the to-be-formed pattern are obtained and the second patterned mask 260 including the complete to-be-formed pattern is formed. Accordingly, the second patterned mask 260 can be used to form the patterned target layer 202P. Significantly, by forming the to-be-formed pattern in the second patterned mask 260 in two steps, the 2D features 204a and 1D features 204b and 206 can be precisely and accurately formed without increasing process cost and process complexity.

One aspect of the present disclosure provides a method for preparing a semiconductor structure. The method includes the following steps. A target layer is formed over a substrate. A first patterned mask is formed over the target layer. In some embodiments, the first patterned mask includes a plurality of first openings separate from each other. The plurality of first openings are filled with a first sacrificial layer. A patterned core layer is formed on the first sacrificial layer. In some embodiments, the patterned core layer includes a plurality of closed patterns and a plurality of second openings within the plurality of closed patterns. A plurality of spacers are formed on sidewalls of the patterned core layer. The plurality of spacers are removed to form a plurality of third openings over the substrate. The first sacrificial layer and the first patterned mask are etched through the plurality of third openings. The first sacrificial layer is removed to form a second patterned mask on the target layer. The target layer is etched through the second patterned mask to form a patterned target layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor pattern structure, comprising:
    forming a target layer over a substrate;
    forming a first patterned mask over the target layer, wherein the first patterned mask comprises a plurality of first openings separate from each other;
    filling the plurality of first openings with a first sacrificial layer;
    forming a patterned core layer on the first sacrificial layer, wherein the patterned core layer comprises a plurality of closed patterns and a plurality of second openings within the plurality of closed patterns;
    forming a plurality of spacers on sidewalls of the patterned core layer;
    filling the plurality of second openings with a second sacrificial layer;
    removing the plurality of spacers to form a plurality of third openings over the substrate;
    etching the first sacrificial layer and the first patterned mask through the plurality of third openings; and
    removing the first sacrificial layer to form a second patterned mask on the target layer.

2. The method of claim 1, wherein the first patterned mask further comprises a plurality of edge-cutting openings, and the plurality of edge-cutting openings are separate from the plurality of first openings.

3. The method of claim 2, wherein the plurality of edge-cutting openings comprise a plurality of first portions and a plurality of second portions coupled to the plurality of first portions, the plurality of first portions of the plurality of edge-cutting openings and the plurality of first openings extend along a first direction, and the plurality of second portions of the plurality of edge-cutting openings extend along a second direction.

4. The method of claim 3, wherein the first direction is different from the second direction.

5. The method of claim 1, wherein the first sacrificial layer comprises a multi-layered structure.

6. The method of claim 1, wherein a top surface of the first sacrificial layer is higher than a top surface of the first patterned mask.

7. The method of claim 1, wherein the patterned core layer further comprises at least an isolated pattern disposed within one of the plurality of closed patterns, and the isolated pattern is separated from the one of the plurality of closed patterns by the plurality of second openings.

8. The method of claim 7, wherein the plurality of closed patterns comprise a plurality of third portions and a plurality of fourth portions extending along a first direction and a plurality of fifth portions extending along a second direction different from the first direction.

9. The method of claim 8, wherein the plurality of third portions and the plurality of fourth portions are alternately arranged.

10. The method of claim 8, wherein a width of the plurality of third portions is greater than a width of the plurality of fourth portions.

11. The method of claim 1, wherein the forming of the plurality of spacers further comprises:
  disposing a spacer layer to cover sidewalls and bottoms of the plurality of second openings and a top surface of the patterned core layer; and
  removing portions of the spacer layer from the top surface of the patterned core layer to form the plurality of spacers.

12. The method of claim 1, wherein a top surface of the second sacrificial layer is coplanar with top surfaces of the plurality of spacers and a top surface of the patterned core layer.

13. The method of claim 1, wherein the second patterned mask comprises a plurality of fourth openings and a plurality of fifth openings, wherein the plurality of fourth openings and the plurality of fifth openings are coupled to each other.

14. The method of claim 13, wherein the plurality of fourth openings of the second patterned mask are formed corresponding to the plurality of first openings of the first patterned mask.

15. The method of claim 13, wherein the plurality of fifth openings are formed corresponding to the plurality of third openings.

16. The method of claim 1, further comprising etching the target layer through the second patterned mask to form a patterned target layer.

17. The method of claim 16, wherein the patterned target layer comprises a plurality of first features and a plurality of second features, the plurality of first features are two-dimensional (2D) features, and the plurality of second features are one-dimensional (1D) features.

18. The method of claim 17, wherein the plurality of first features and the plurality of second features are separate from each other.

19. The method of claim 16, wherein the patterned target layer further comprises a pair of edge features disposed at a top side and a bottom side of the semiconductor structure from a top view.

20. The method of claim 19, wherein the pair of edge features are separate from the plurality of first features and the plurality of second features.

* * * * *